United States Patent
Ranade et al.

(10) Patent No.: US 6,544,838 B2
(45) Date of Patent: Apr. 8, 2003

(54) METHOD OF DEEP TRENCH FORMATION WITH IMPROVED PROFILE CONTROL AND SURFACE AREA

(75) Inventors: Rajiv Ranade, Brewster, NY (US); Munir D. Naeem, Poughkeepsie, NY (US); Gangadhara S. Mathad, Poughkeepsie, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/805,071

(22) Filed: Mar. 13, 2001

(65) Prior Publication Data

US 2002/0132422 A1 Sep. 19, 2002

(51) Int. Cl.$^7$ .......................................... H01L 21/8242
(52) U.S. Cl. ..................... 438/244; 438/243; 438/386; 438/387
(58) Field of Search ................. 438/243–249, 438/386–392

(56) References Cited

U.S. PATENT DOCUMENTS

| | | |
|---|---|---|
| 4,726,879 A | 2/1988 | Bondur et al. |
| 5,112,771 A | 5/1992 | Ishii et al. |
| 5,176,789 A | 1/1993 | Yamazaki et al. |
| 5,409,563 A | 4/1995 | Cathey |
| 5,605,600 A | 2/1997 | Muller et al. |
| 5,629,226 A | 5/1997 | Ohtsuki |
| 5,677,225 A | 10/1997 | Park |
| 5,877,061 A | 3/1999 | Halle et al. |
| 5,891,807 A * | 4/1999 | Muller et al. ................ 438/713 |
| 5,930,107 A | 7/1999 | Rajeevakumar |
| 5,937,296 A | 8/1999 | Arnold |
| 5,943,581 A | 8/1999 | Lu et al. |
| 5,945,704 A | 8/1999 | Schrems et al. |
| 6,303,513 B1 * | 10/2001 | Khan et al. ................ 438/714 |
| 6,319,788 B1 * | 11/2001 | Gruening et al. ........... 438/386 |
| 6,352,892 B2 * | 3/2002 | Jammy et al. .............. 438/244 |
| 6,387,773 B1 * | 5/2002 | Engelhardt ................ 438/386 |
| 2001/0023956 A1 * | 9/2001 | Collins et al. ............. 257/301 |
| 2001/0055846 A1 * | 12/2001 | Beckmann et al. ......... 438/243 |

OTHER PUBLICATIONS

Kleinhenz et al., "Trench Capacitor and Dry Etching Technique of Forming Same With Increased Capacitance Density Relative to Conventional Trench Capacitor," IBM Technical Disclosure Bulletin, vol. 34, No. 5, Oct. 1991.

* cited by examiner

Primary Examiner—John F. Niebling
Assistant Examiner—Jennifer M. Kennedy
(74) Attorney, Agent, or Firm—Stanton Braden

(57) ABSTRACT

A method for etching trenches includes providing a patterned mask stack on a substrate. A trench is etched in the substrate by forming a tapered-shaped trench portion of the trench, which narrows with depth in the substrate by employing a first plasma chemistry mixture including $O_2$, HBr and $NF_3$. An extended portion of the trench is formed by etching a second profile deeper and wider than the tapered-shaped trench portion in the substrate by employing a second plasma chemistry mixture including $O_2$, HBr and $SF_6$ or $F_2$.

30 Claims, 6 Drawing Sheets

METHOD OF DEEP TRENCH FORMATION WITH IMPROVED PROFILE CONTROL AND SURFACE AREA

BACKGROUND

1. Technical Field

The present invention is related to the fabrication of semiconductor devices, and more particularly, to the etching of high aspect ratio trenches in silicon substrates.

2. Description of the Related Art

The fabrication of deep trenches (DT) in silicon substrates is one method of making charge storage cells, referred to as deep trench capacitors. A deep hole of somewhat conical shape and an oval top cross section is etched into a silicon substrate by a commonly used dry etching method known as reactive ion etching (RIE). A dielectric film usually with a high dielectric constant is then deposited on the trench walls conformally. A doped polysilicon conductor is deposited to fill inside the trench, and a conductive region is formed in the silicon substrate on the other side of the dielectric material. The doped polysilicon conductor and the conductive region serve as the two capacitor plates.

The charge storage capacity of the dielectric film, called the capacitance, is inversely proportional to its film thickness and directly proportional to its area. Thus, the thickness of the film is kept to a minimum to the extent permitted by the process capability to form a continuous film on the trench walls. On the other hand, the inner surface area of the deep trench etched in silicon, is kept as large as possible within the constraints of the trench opening and mask thickness.

There is today an ever increasing need to make the deep trench opening smaller to accommodate more trenches in a given layout area of a chip on the substrate and, hence, to increase productivity and device performance. This reduction process is known to practitioners in the art as ground rule (GR) shrinking. The direct result of GR shrinkage is that the circumference or the perimeter of the DT ends up substantially reduced. To maintain the capacitance requirements of the DT capacitor, its depth must be constantly increased. Such a situation leads to very high aspect ratios, which is defined as the ratio of the depth of the etched structure relative to its width (i.e., if the structure is square or rectangular) or to its diameter (i.e., if the structure is circular or elliptical in shape). Etching of high aspect ratio trenches is made difficult due to reduction of etch rate with depth; and ultimately etching stops at very high aspect ratios.

The etching process in general, and the RIE process in particular, are strongly dependent on the aspect ratio of the structure to be achieved. A typical RIE process used for etching generally involves the deposition of oxide ($SiO_2$) or nitride ($Si_3N_4$) films used as a hard mask. A photolithography process is then employed to open the holes in the hard mask. In subsequent steps, the trench holes are etched in the silicon substrate to form the deep trench capacitor. The process of forming deep trenches using RIE is well known in the art, and is described, e.g., in U.S. Pat. Nos. 5,605,600; 5,409,563; 5,629,226; 5,937,296, 5,891,807, and 5,112,771.

The deep trench silicon RIE process is relatively complex due to the need for etching anisotropic high aspect ratio features and due to continuous reduction of etch rate with increasing depths. Etching is performed in plasma equipment wherein gaseous species, usually containing $Cl_2$, F, Br, and oxygen are ionized by applying radio frequency (RF) power in the capacitive or inductive mode. Etching is achieved by a combination of several mechanisms such as ion bombardment, ion assisted chemical etching and chemical etching (dominated by radicals). The profile control of DT is very important for processes like the filling of trenches with electrode material (e.g., polysilicon).

The RIE process, which may incorporate a controlled way of simultaneous deposition (of sidewall passivation film) and etching (of silicon trench and controlled etching of the passivation film), is tailored to control the profile and prevent isotropic etching. This objective is achieved by controlling the formation and the thickness of a passivation film on the walls of trenches as etching proceeds.

The role of passivation in deep trench etching and profile control has been described by Muller et al. in the aforementioned U.S. Pat. No. 5,605,600, wherein the effect of substrate temperature on the formation of passivation is described in detail. The process of high aspect ratio etching is also described by Cathey in the previously mentioned U.S. Pat. No. 5,409,563.

With the requirement of GR shrinkage, the control of DT sidewall (SW) passivation and inadequate mask selectivity have become important issues and an impediment in achieving deeper trenches. The depth to which a trench can be etched is limited by the mask thickness. In other words, for a given mask thickness the trench cannot be etched deeper than the thickness of the hard mask permits; otherwise the mask, particularly at the edge of the wafer, gets eroded causing black silicon which is a yield reducer. Achieving high selectivity between the silicon and the mask is at least as important as achieving high silicon etch rates.

The aforementioned task of forming storage capacitors with desired capacitance values finds its way into many applications, e.g., during the construction of certain classes of semiconductor devices, such as DRAMs (dynamic random access memory) which typically use two types of capacitors to store charge: i) capacitors formed in deep trench holes in crystalline silicon and ii) stacked capacitors. One important device parameter in these memory devices is the capacitance value of the memory cell. Higher values are preferred to increase the charge retention time in these cells. In the case of trench capacitor based devices, the capacitance value of a cell is proportional to the trench wall area, which in turn depends linearly upon the trench depth for a given trench opening dimension. As previously described, achieving large trench depths or larger wall area is therefore important in fabricating robust memory cells having large retention times.

Therefore, a need exists for a method for improving the fabrication of deep trench capacitors to increase trench depth and wall area to permit better retention times and to increase capacitance.

SUMMARY OF THE INVENTION

A method for etching trenches includes providing a patterned mask stack on a substrate. A trench is etched in the substrate by forming a tapered-shaped trench portion of the trench, which narrows with depth in the substrate by employing a first plasma chemistry mixture including $O_2$, HBr and $NF_3$. An extended portion of the trench is formed by etching a second profile deeper and wider than the tapered-shaped trench portion in the substrate by employing a second plasma chemistry mixture including $O_2$, HBr and $SF_6$ or $F_2$.

Another method for etching trenches includes the steps of forming a plurality of dielectric layers on a silicon substrate to form a mask stack, and patterning the mask stack down to the silicon substrate to form an opening corresponding to a position where a deep trench is to be formed. Native oxide is removed from the silicon substrate at the position where the deep trench is to be formed and a trench is etched in the silicon substrate at the position. The etching of the trench includes plasma etching a tapered-shaped trench portion of the trench which narrows with depth in the silicon substrate by employing a first plasma chemistry mixture including $O_2$, HBr and $NF_3$ and, in a same plasma reaction chamber, plasma etching an extended portion of the trench by etching a second profile deeper and wider than the tapered-shaped trench portion in the substrate by employing a second plasma chemistry mixture including $O_2$, HBr and $SF_6$ or $F_2$. A controlled isotropic profile is formed thereby suitable for use with deep trench capacitors.

In other embodiments, the step of plasma etching the extended portion may include the step of resetting a Radio Frequency (RF) power of a plasma reaction chamber from a setting of the RF power for the step of forming a tapered-shaped trench portion. The RF power for the step of plasma etching the tapered-shaped trench portion may be between about 500–1300 Watts, and the RF power may be reset to between about 550 to about 3000 Watts. The first plasma chemistry mixture may include about 70–90 volume % HBr. The first plasma chemistry mixture may include about 4–10 volume % $NF_3$. The second plasma chemistry mixture may include about 70–95 volume % HBr. The second plasma chemistry mixture may include about 1–5 volume % $SF_6$ or 1–5 volume % $F_2$. The step of plasma etching the extended portion of the trench preferably includes forming a passivation layer during the plasma etching of the extended portion.

The present invention increases the selectivity of the mask stack with respect to silicon e.g. higher silicon:mask etch rate ratio and provides methods for increasing the trench wall area. The present invention provides a trench with two profiles, a tapered profile to facilitate filling and an isotropic profile to enhance the trench wall area. Methods for etching high aspect ratio semiconductor structures in silicon and other similar materials is presented. The present invention also enhances the capacitance of a DRAM cell by etching deeper and wider trenches. The second plasma chemistry mixture may include a higher selectivity ratio of the mask stack to the silicon substrate than the first plasma chemistry mixture such that a controlled isotropic profile is formed in the extended portion suitable for use with deep trench capacitors.

High aspect ratio trenches are etched in silicon in an $HBr/O_2$ based plasma with the addition of an additive gas like NF3 to produce an anisotropically etched tapered profile at high silicon etch rates in the top portion of the trench. A high aspect ratio trench is etched in silicon in an $HBr/O_2$ based plasma with the addition of an electronegative F-containing additive gas like $SF_6$ to decrease the degree of anisotropy so as to produce controlled amount of lateral etching of silicon in the bottom portion of the trench, while simultaneously achieving high mask selectivity from reduced self-developed DC bias on the wafer and prevent merging of adjacent trenches, and thereby obtain a larger trench wall area for larger capacitance.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides an improved method for forming deep trenches in a substrate. By the present invention, trenches are formed which are deeper and provide higher aspect ratio semiconductor structures in silicon and other similar materials. By etching deeper and wider trenches, the present invention also enhances the capacitance for deep trench capacitors, which may be formed in the trenches.

The trenches include trench wall profiles, which may increase trench wall area. The methods for increasing trench wall area are controllable to provide desired trench profiles. In one embodiment, a trench with two profiles is provided: a tapered profile to facilitate filling of the trench and an isotropic profile (e.g., a bottle shape with a larger depth than width dimension) to enhance the trench wall area.

Another aspect of the present invention is to increase the selectivity of a mask stack with respect to a substrate material which is to be etched in accordance with a pattern formed in the mask stack, e.g., higher silicon: mask etch rate ratio. For example, selectivity is increased by at least 100% over prior art methods. In preferred embodiments, achieved selectivities may be between about 6:1 to about 12:1. High aspect ratio trenches are also achieved by the present invention. The present invention is particularly useful for aspect ratios of greater than four to one. Other aspect ratio trenches are also contemplated.

The present invention will now be described in terms of illustrative embodiments. The present invention should not be construed as limited by these illustrative examples as the invention is broader and may be employed with other materials, structures and steps.

Figure 1:
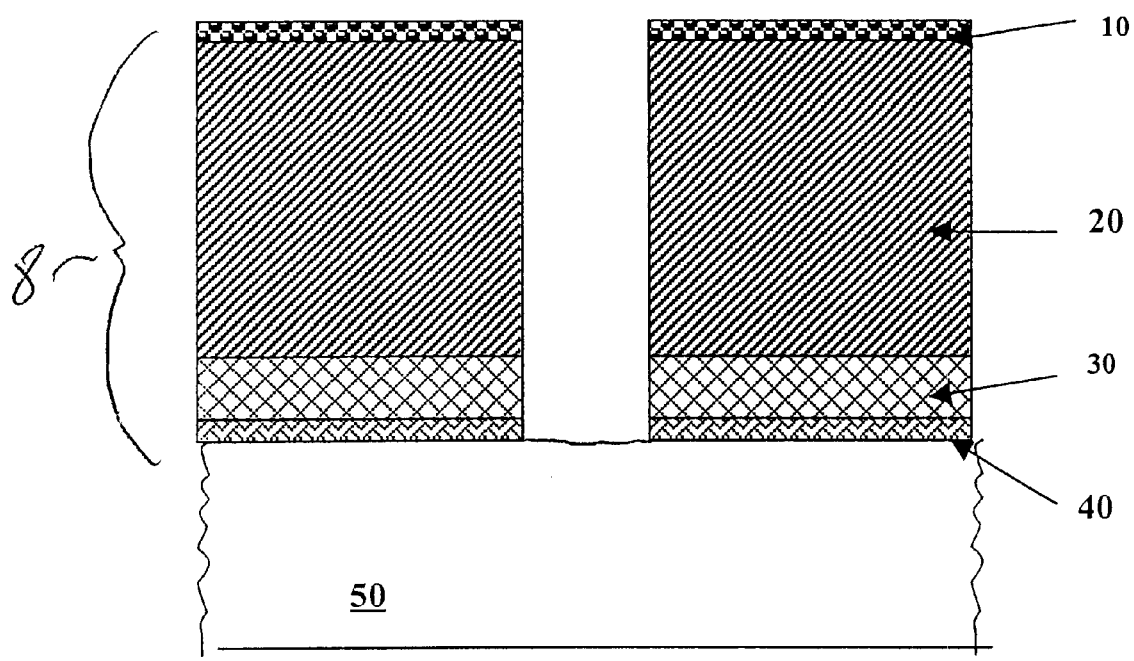
FIG. 1 is a cross-sectional view of a patterned trench mask stack in accordance with the present invention.

Referring now in specific detail to the drawings in which like reference numerals identify similar or identical elements throughout the several views, and initially to FIG. 1, a mask stack 8 is shown formed on a substrate 50. Substrate 50 preferably includes a silicon substrate; however, other materials may be employed in accordance with the invention. Mask stack 8 includes a plurality of dielectric layers to form a hard mask to transfer a trench pattern into substrate 50. Mask stack 8 includes a first pad dielectric layer 40, preferably a pad oxide a layer, and a second pad dielectric layer 30, preferably a pad nitride layer. A relatively thicker mask layer 20 is formed on layer 40. Layer 20 provides a large portion of the etch mask to form trenches in substrate 50.

Layer 20 may include a silicate glass, such as, for example, a boron silicate glass (BSG) or boro-phosphor silicate glass (BPSG) layer. A cap dielectric layer 10 may be formed on layer 20. Layer 10 may include an oxide layer.

In a preferred embodiment, mask stack 8 includes a plasma enhanced TEOS (PETEOS) or similar cap oxide layer 10. A doped oxide, such as a BSG or BPSG, for layer 20. Layer 30 may include a nitride film, and layer 40 may include a thin pad oxide layer. All of these layers are deposited on a silicon substrate 50.

Lithography processes follow to pattern mask stack (hard mask) 8. Hard mask stack layers 10, 20, 30, and 40 are etched using conventional reactive ion etch (RIE) methods. After etching hard mask 8, the resist layer is removed.

Figure 2:
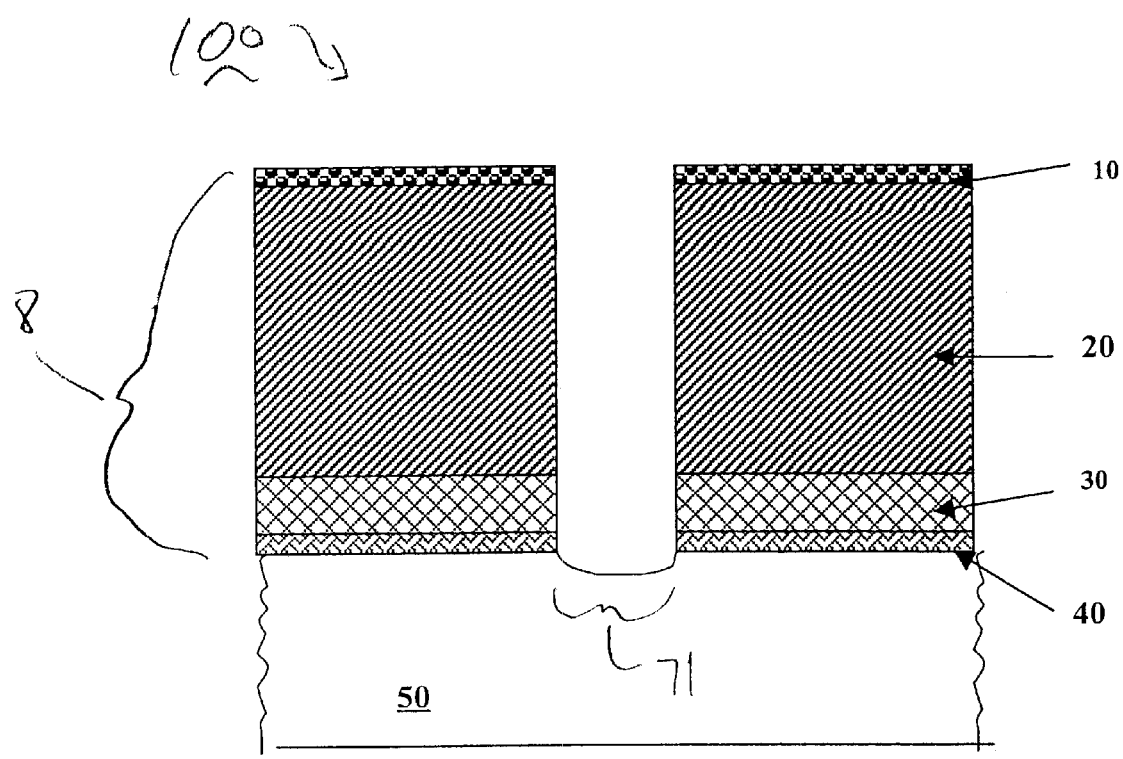
FIG. 2 is a cross-sectional view of the patterned trench mask stack of FIG. 1 after a native oxide is removed from a surface of the substrate in accordance with the present invention.
Figure 3:
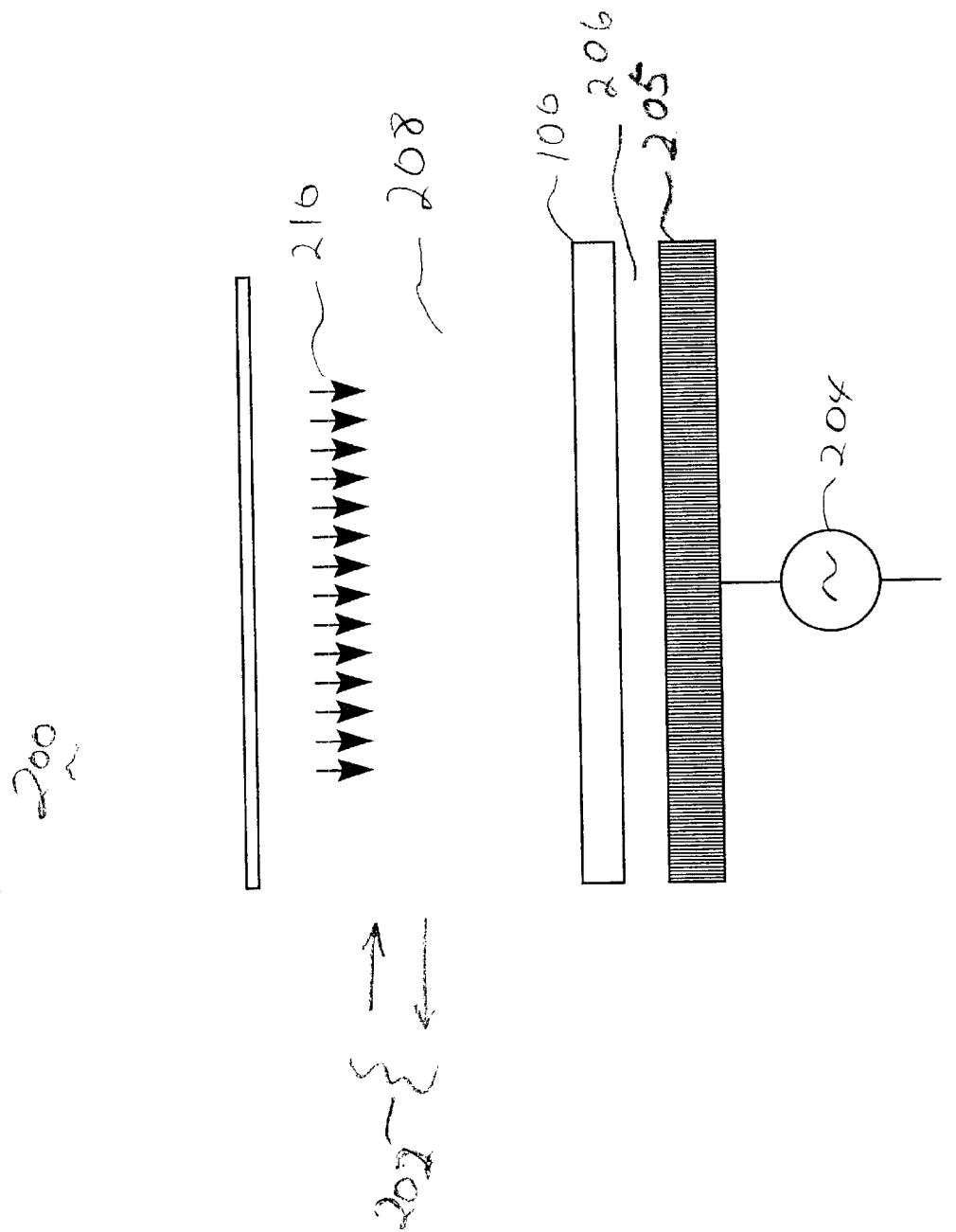
FIG. 3 is a schematic diagram of a plasma chamber employed for carrying out the present invention.

Referring to FIG. 2, a wafer 100 with patterned hard mask stack 8 (no resist is present at this time) is placed in a plasma reactor 200 as show in FIG. 3. Plasma reactor 200 includes gas inlets and outlets 202 and RF power supplies 204 as is known in the art.

A breakthrough is provided in region 71. Plasma used for this breakthrough step preferably includes HBr, $NF_3$, and $O_2$ gas mixtures at less than about 500 W RF power. The ranges of other process parameters may include: a wafer electrode 205 (FIG. 3) temperature of between about 20° C. and about 150° C., wafer backside helium pressure (region 206 in FIG. 3) of about 2 torr and 30 torr, reactor pressure (in region 208) of between about 20 mtorr and about 300 mtorr, and gas flows (plasma 210) of between about 100 and about 300 sccm HBr, between about 4 and about 25 sccm $NF_3$, and between about 0 and about 25 sccm $O_2$ or He-$O_2$ mixture. Other process parameters or combinations of parameters are also contemplated.

Figure 4:
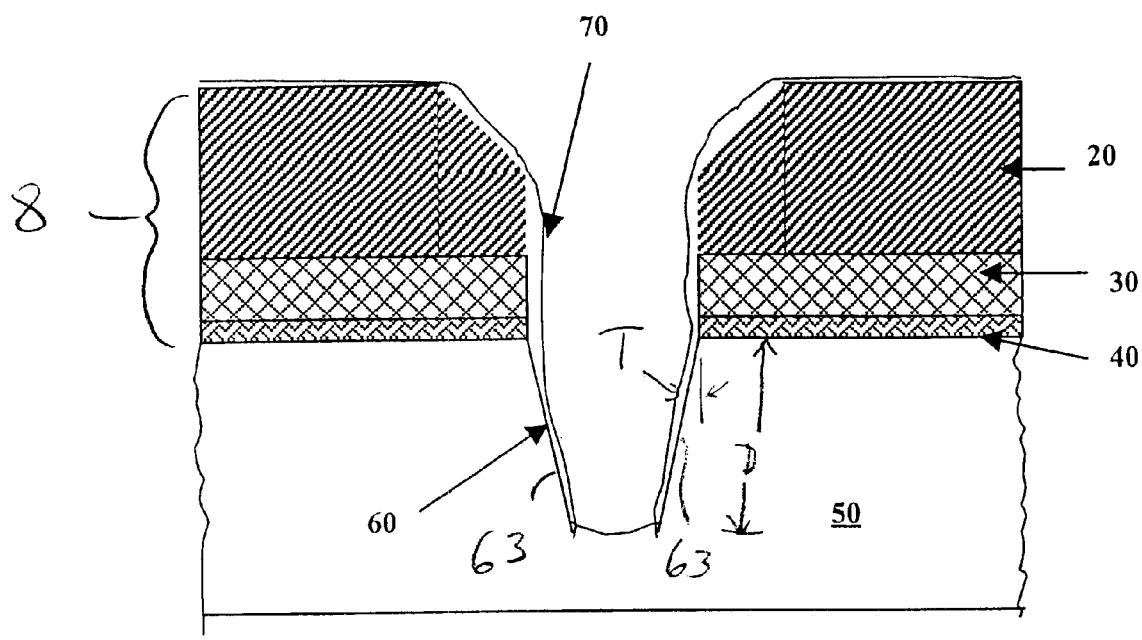
FIG. 4 is a cross-sectional view showing a partially etched tapered trench with a side wall passivation film formed in accordance with the present invention.

During the breakthrough etch, any native oxide present on the surface of the open silicon areas (e.g., region 71) is etched away to prevent the formation of a micro-mask, which if present would produce rough or grassy silicon surfaces during trench etching (in the step depicted in FIG. 4). During this process, some of the silicon in the substrate 50 may be etched.

Referring to FIG. 4, after the breakthrough step is completed, a taper etch step is performed with gases described above (e.g., between about 20 mtorr and about 300 mtorr, and gas flows of between about 100 and about 300 sccm HBr, between about 4 and about 25 sccm $NF_3$, and between about 0 and about 25 sccm $O_2$ or He-$O_2$ mixture) for desired profile control to facilitate other processes to follow later. Etching of substrate 50 is performed to initiate the formation of a deep trench (DT) 60 (FIG. 4) in substrate 50. The process preferably includes the formation of a passivation layer 70. Methods for a controlled growth of passivation layer 70 are provided to prevent isotropic etching to help achieve a straight wall DT profile. Formation of passivation layer 70 may be performed by methods known in the art. The presence of oxygen provides sidewall passivation formation to promote higher aspect ratio trenches.

Preferably using the same reactor as before with wafer 100 in place (see FIG. 3), the breakthrough process is changed so that the RF power now is set in the range of between about 200 and about 3000 watts. The remaining process parameters are set in the same range as described above for the initial etching of trench 60 in FIG. 2. Silicon etching is completed when the depth (D) achieved is in the range of between about 5% to about 50% of a final depth needed for the trench. The partially etched trench 60 is shown in FIG. 4 with tapered sidewalls 63. Passivation film 70 is formed on the trench sidewalls 63 also as shown. A taper angle, T, may be between about 5 degrees to about 30 degrees (relative to a surface normal to the top surface of the substrate) depending on the depth of the tapered region and the dimensions of the trench opening. The taper angle T is well controlled by the process parameters of the plasma etching method.

Figure 5:
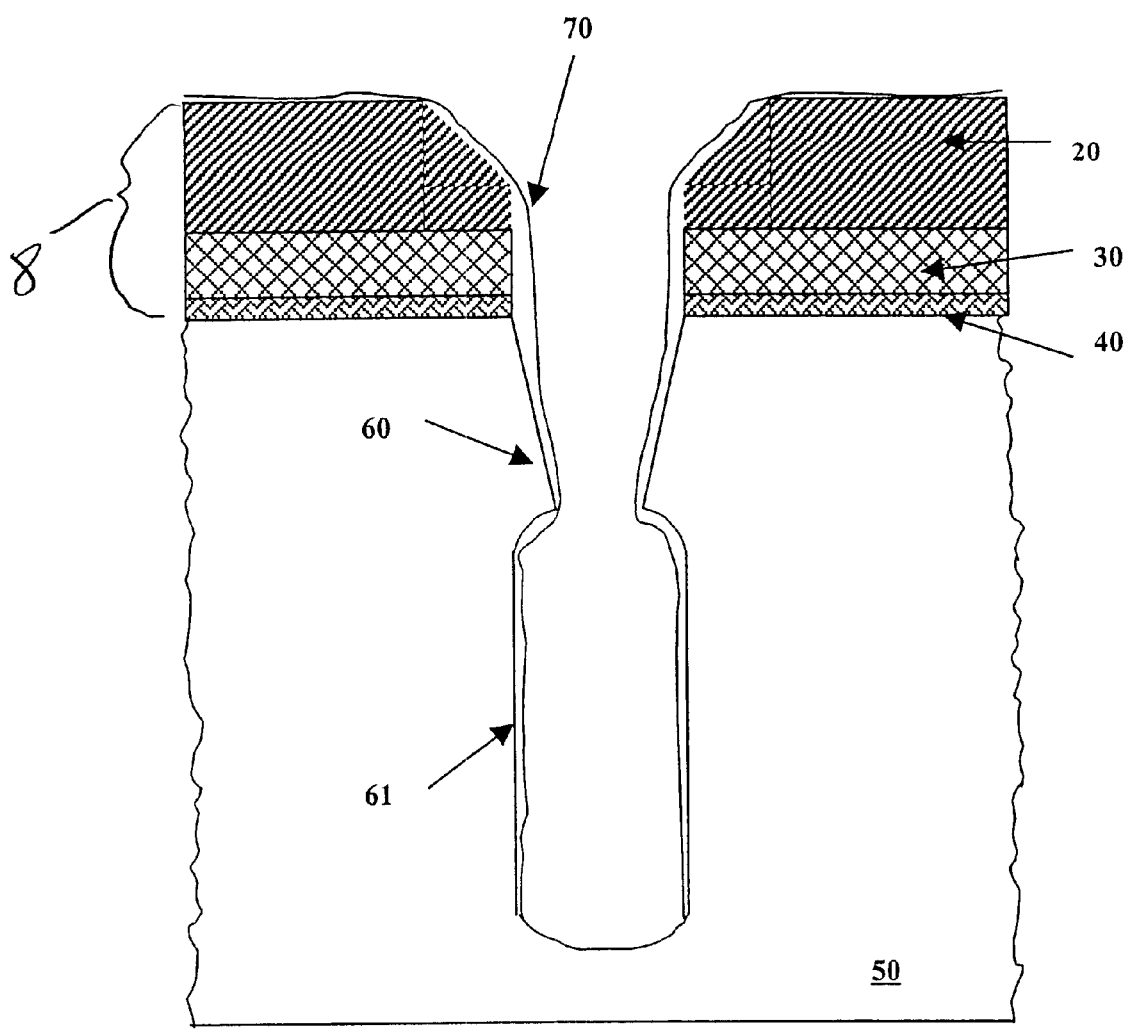
FIG. 5 is a cross-sectional view showing a fully etched deep trench with both tapered and controlled isotropic profiles with a side wall passivation film in accordance with the present invention.

Referring to FIG. 5, after the taper etching step is completed, the silicon etching plasma is changed to improve the mask selectivity and to increase the trench wall area. The etching gases are changed, preferably in the same plasma chamber (see FIG. 3), to a predetermined gas mixture of hydrogen bromide (HBr), sulfur hexa-fluoride ($SF_6$) or molecular fluorine ($F_2$) and oxygen ($O_2$) or predetermined mixture of helium and oxygen (He-$O_2$). Any other fluorine containing electronegative gas can also be substituted for $SF_6$ or $F_2$. Preferred ranges of process parameters for one embodiment of the present invention may include: wafer electrode temperature of between about 20° C. to about 200° C., wafer backside helium pressure of between about 2 to about 30 torr, reactor pressure of between about 20 to about 300 mtorr, and gas flows of between about 100 to about 300 sccm HBr, about 4 to about 25 sccm $SF_6$, about 0 to about 25 sccm $O_2$ or He-$O_2$ mixture.

By resetting the RF power for the second plasma chemistry (e.g., including HBr and $SF_6$), a deeper and wider trench profile is simultaneously achieved. Advantageously, this etching with $SF_6$ or $F_2$ can be sustained over a longer duration since selectivity to materials of mask stack 8 is increased.

The plasma of the present invention advantageously achieves the following: 1) reduces the mask etch rate of mask stack 8 as compared to the $NF_3$ based plasma described above and thereby increases the mask selectivity, 2) achieves a controlled isotropic bottle shape etch profile and thereby yields a larger wall area as compared to a straight or tapered wall profile, and 3) keeps the trench walls free of defects like random pockets or slivers. The controlled isotropic etching behavior of sulfur hexafluoride ($SF_6$) is due to reduced thickness of sidewall passivation and the increased mask selectivity (or reduced mask etch rate) is due to reduced ion bombardment at the mask surface in the $SF_6$-based plasma (or other electronegative gas) This bottle-shaped profile 61 is shown in FIG. 5.

In the present invention, the bottle shaped profile is obtained by employing a gas mixture (hydrogen bromide (HBr), sulfur hexa-fluoride ($SF_6$) or molecular fluorine ($F_2$) and oxygen ($O_2$) or mixture of helium and oxygen (He-$O_2$)) to provide an etching which adds a controlled degree of an isotropic component with an anisotropic component while achieving high selectivity to the trench mask.

The present invention is different from the process described in Kleinhenz et al. in IBM Technical Disclosure Bulletin, Vol. 34, No. 5, October 1991. The process of Kleinhenz produces a silicon trench with a tapered profile at the top portion and an isotropic profile in the bottom portion. The top part is etched using a plasma of HCl/$BCl_3$/$O_2$ so as to passivate the sidewall with an oxide and thereby obtain a tapered etch profile. The isotropic profile in the lower part is obtained by using an $SF_6$-only plasma which produces a purely isotropic (etch depth equal in all directions) profile since there is no sidewall deposition of oxide during this part of the process. In the absence of any passivation, fluorine produced in an $SF_6$ plasma etches silicon laterally at the same rate as in the vertical direction. A corrugated profile is produced when the two processes (namely, anisotropic and isotropic process steps) are alternated.

In the present invention, the profile of Kleinhenz is unsuited to build a useful DRAM capacitor since a pure isotropic profile (as against a bottle-shaped profile with a reasonable aspect ratio) will be hard to fill with a polysilicon conductor and make an electrical contact to a node dielectric film deposited on the bottom portion of the trench sidewall. Furthermore, trenches with this profile are not extendable for high density DRAMs, where the spacings between two adjacent trenches are very small. An isotropic profile, as describe in Kleinhenz, will result in the merging of the adjacent trenches, making the capacitors inoperable.

For the present invention, the top and bottom portions of the silicon trench are etched with anisotropic etching processes, except that degree of anisotropy is decreased (or isotropy increased) in the etching of the lower portion of the trench. The $HBr/O_2$ and $NF_3$ based plasma produces a profile with high degree of anisotropy (a tapered profile) due to sidewall passivation with an oxide-like film. During this part, the present invention makes use of the potentially high silicon etch rate (RIE lag is low at low aspect ratios) by using $NF_3$ which gives higher silicon etch rates (as compared to $SF_6$). HBr plasma (as opposed to HCl plasma) keeps the mask selectivity high. In the lower trench formation, a precisely controlled degree of isotropy is achieved by replacing the additive gas-$NF_3$ with $SF_6$, which produces a controlled degree of lateral etching at a reduced silicon etch rate, while increasing the mask selectivity. Substitution of $SF_6$ in the plasma reduces the mask erosion due to reduced self-developed DC bias on the wafer from the electronegative nature of the $SF_6$ plasma.

Sidewall passivation and silicon etching is provided in the etching of the lower portion of the trench (etchant include both HBr and $O_2$, as in the etching of the tapered portion of the trench. In the fabrication of Mbit and Gbit DRAMs, the degree of isotropy (e.g. bottle shape) is precisely controlled to facilitate proper filling with the conductor material while preserving the spacing between two adjacent trenches.

Figure 6:
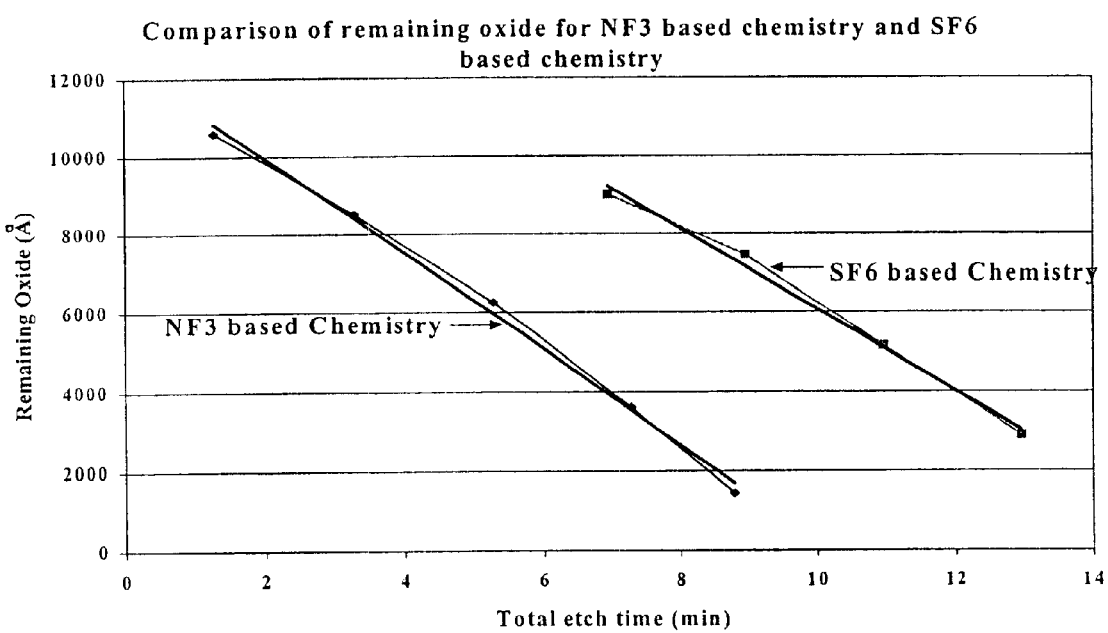
FIG. 6 is a plot of experimental results showing deep trench mask thickness remaining versus etching time for both $NF_3$ and $SF_6$ based plasmas.

Referring to FIG. 6, the mask stack thickness (e.g., the thickness of layer 20) remaining as a function of etch time for the $NF_3$-based plasma and $SF_6$-based plasma are illustratively compared. FIG. 6 shows a significantly thicker mask remaining in the $SF_6$-based plasma as compared to the $NF_3$-based plasma. The thicker mask remaining permits trenches (e.g., trenches 60 and 61 in FIG. 5) to be etched for a longer time thereby achieving deeper trenches for a given initial mask thickness. The thicker mask is a result of improved etch selectivity between mask stack 8 and substrate 50. Etch selectivity is increased, in preferred embodiments, by between about 6:1 to about 12:1 by employing, for example, $SF_6$ instead of $NF_3$. The total depth of deep trenches may be between about 6 microns and 7.5 microns for 0.15 micron ground rules, in accordance with the present invention. Trenches (e.g., region 61) may be widened to between about 0% and about 50%.

$SF_6$-based plasma in accordance with the present invention achieves at least the following simultaneously: 1) deeper trenches due to higher mask selectivity and 2) wider trenches (in deeper portions) due to higher fluorine density and thinner sidewall passivation films in this plasma contributing to the isotropic component, and 3) trench walls, free of surface anomalies.

Having described preferred embodiments for method of deep trench formation with improved profile control and surface area (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for etching trenches, comprising the steps of:
providing a patterned mask stack on a substrate;
etching a trench in the substrate by:
forming a tapered-shaped trench portion of the trench, which narrows with depth in the substrate by employing a first plasma chemistry mixture including $O_2$, HBr and $NF_3$;
forming an extended portion of the trench by etching a second profile having a substantially bottle-shaped profile in the substrate by employing a second plasma chemistry mixture including $O_2$, HBr and $SF_6$ or $F_2$, wherein the $SF_6$ or $F_2$ is substituted for the $NF_3$ in the first plasma chemistry, and wherein the extended portion of the trench is wider than the tapered-shaped trench portion.

2. The method as recited in claim 1, wherein the step of forming the extended portion includes the steps of resetting a Radio Frequency (RF) power of a plasma reaction chamber from a setting of the RF power for the step of forming the tapered-shaped trench portion.

3. The method as recited in claim 2, wherein the RF power for the step of forming a tapered-shaped trench portion is between about 500–1300 Watts.

4. The method as recited in claim 3, wherein step of resetting the bias power includes resetting the bias power to between about 550 to about 3000 Watts.

5. The method as recited in claim 1, wherein the first plasma chemistry mixture includes about 70–90 volume % HBr.

6. The method as recited in claim 5, wherein the first plasma chemistry mixture includes about 4–10 volume % $NF_3$.

7. The method as recited in claim 1, wherein the second plasma chemistry mixture includes about 70–95 volume % HBr.

8. The method as recited in claim 7, wherein the second plasma chemistry mixture includes about 1–5 volume % $SF_6$.

9. The method as recited in claim 7, wherein the second plasma chemistry mixture includes about 1–5 volume % $F_2$.

10. The method as recited in claim 1, wherein the step of forming the extended portion of the trench includes forming a passivation layer during the forming of the extended portion.

11. A method for etching trenches, comprising the steps of:
forming a plurality of dielectric layers on a silicon substrate to form a mask stack;
patterning the mask stack down to the silicon substrate to form an opening corresponding to a position where a deep trench is to be formed;
removing native oxide from the silicon substrate at the position where the deep trench is to be formed;
etching a trench in the silicon substrate at the position by:
plasma etching a tapered-shaped trench portion of the trench which narrows with depth in the silicon substrate by employing a first plasma chemistry mixture including $O_2$, HBr and $NF_3$;

in a same plasma reaction chamber, plasma etching an extended portion of the trench by etching a second profile having a substantially bottle-shaped profile in the substrate by employing a second plasma chemistry mixture including $O_2$, HBr and $SF_6$ or $F_2$, wherein the $SF_6$ or $F_2$ is substituted for the $NF_3$ in the first plasma chemistry such that the second plasma chemistry mixture provides control of a degree of lateral etching of the second profile such that a controlled isotropic profile is formed suitable for use with deep trench capacitors.

12. The method as recited in claim 11, wherein the step of plasma etching the extended portion includes the steps of resetting a Radio Frequency (RF) power of a plasma reaction chamber from a setting of the RF power for the step of forming the tapered-shaped trench portion.

13. The method as recited in claim 12, wherein the RF power for the step of plasma etching the tapered-shaped trench portion is between about 500–1300 Watts.

14. The method as recited in claim 13, wherein step of resetting the bias power includes resetting the bias power to between about 550 to about 3000 Watts.

15. The method as recited in claim 11, wherein the first plasma chemistry mixture includes about 70–90 volume HBr.

16. The method as recited in claim 15, wherein the first plasma chemistry mixture includes about 4–10 volume $NF_3$.

17. The method as recited in claim 11, wherein the second plasma chemistry mixture includes about 70–95 volume % HBr.

18. The method as recited in claim 17, wherein the second plasma chemistry mixture includes about 1–5 volume % $SF_6$.

19. The method as recited in claim 17, wherein the second plasma chemistry mixture includes about 1–5 volume % $F_2$.

20. The method as recited in claim 11, wherein the step of plasma etching the extended portion of the trench includes forming a passivation layer during the plasma etching of the extended portion.

21. A method for etching trenches, comprising the steps of:
    forming a plurality of dielectric layers on a silicon substrate to form a mask stack;
    patterning the mask stack down to the silicon substrate to form an opening corresponding to a position where a deep trench is to be formed;
    removing native oxide from the silicon substrate at the position where the deep trench is to be formed;
    etching a trench in the silicon substrate at the position by:
        plasma etching a tapered-shaped trench portion of the trench which narrows with depth in the silicon substrate by employing a first plasma chemistry mixture including $O_2$, HBr and $NF_3$;
        in a same plasma reaction chamber, plasma etching an extended portion of the trench by resetting a bias power of the plasma chamber and etching a second profile having a substantially bottle-shaped profile in the substrate by employing a second plasma chemistry mixture including $O_2$, HBr and $SF^6$ or $F^2$, wherein the $SF^6$ or $F^2$ is substituted for the NF3 in the first plasma chemistry such that the second plasma chemistry mixture includes a higher selectivity ratio of the mask stack to the silicon substrate than the first plasma chemistry mixture and such that a controlled isotropic profile is formed in the extended portion suitable for use with deep trench capacitors.

22. The method as recited in claim 21, wherein the step of plasma etching the extended portion includes the steps of resetting a Radio Frequency (RF) power of a plasma reaction chamber from a setting of the RF power for the step of forming the tapered-shaped trench portion.

23. The method as recited in claim 22, wherein the RF power for the step of plasma etching the tapered-shaped trench portion is between about 500–1300 Watts.

24. The method as recited in claim 23, wherein step of resetting the bias power includes resetting the bias power to between about 550 to about 3000 Watts.

25. The method as recited in claim 21, wherein the first plasma chemistry mixture includes about 70–90 volume % HBr.

26. The method as recited in claim 25, wherein the first plasma chemistry mixture includes about 4–10 volume % $NF_3$.

27. The method as recited in claim 21, wherein the second plasma chemistry mixture includes about 70–95 volume % HBr.

28. The method as recited in claim 27, wherein the second plasma chemistry mixture includes about 1–5 volume % $SF_6$.

29. The method as recited in claim 27, wherein the second plasma chemistry mixture includes about 1–5 volume % $F_2$.

30. The method as recited in claim 22, wherein the step of plasma etching the extended portion of the trench includes forming a passivation layer during the plasma etching of the extended portion.

* * * * *